United States Patent [19]

Belna

[11] Patent Number: 4,624,617
[45] Date of Patent: Nov. 25, 1986

[54] LINEAR INDUCTION SEMICONDUCTOR WAFER TRANSPORTATION APPARATUS

[76] Inventor: David Belna, 251 Sierks St., Costa Mesa, Calif. 92627

[21] Appl. No.: 659,185

[22] Filed: Oct. 9, 1984

[51] Int. Cl.$^4$ .............................................. B60L 13/10
[52] U.S. Cl. ..................................... 414/347; 104/282; 104/284; 104/292; 198/619; 318/135
[58] Field of Search ................... 104/88, 281–286, 104/290, 292, 293; 191/10; 198/619; 308/10; 310/12, 13; 318/135; 414/337, 338, 340, 347

[56] References Cited

U.S. PATENT DOCUMENTS

| | | | |
|---|---|---|---|
| 384,775 | 6/1888 | Mengis | 198/619 X |
| 1,441,250 | 1/1923 | Smith | 198/619 X |
| 3,265,911 | 8/1966 | Madsen | 310/12 |
| 3,407,749 | 10/1968 | Frig | 104/282 |
| 3,589,300 | 6/1971 | Wipf | 104/281 |
| 3,610,161 | 10/1971 | Wishart | 104/88 |
| 3,692,168 | 9/1972 | Hughes, Jr. et al. | 310/12 |
| 3,750,803 | 8/1973 | Paxton | 104/282 |
| 3,783,794 | 1/1974 | Gopfert et al. | 104/283 |
| 3,788,447 | 1/1974 | Stephanoff | 198/619 |
| 3,792,665 | 2/1974 | Nelson | 104/292 |
| 3,815,511 | 6/1974 | Dukowicz et al. | 104/282 |
| 3,828,686 | 8/1974 | Steenbeck et al. | 104/292 X |
| 3,834,318 | 9/1974 | Fellows et al. | 104/290 X |
| 3,842,750 | 10/1974 | Miericke | 104/285 |
| 3,927,620 | 12/1975 | Chapham | 104/282 |
| 3,951,074 | 4/1976 | Cooper | 104/283 |
| 3,974,778 | 8/1976 | Black et al. | 104/292 |
| 4,166,563 | 9/1979 | Peyraud et al. | 198/619 X |
| 4,276,832 | 7/1981 | Sika et al. | 104/292 |
| 4,324,185 | 4/1982 | Vinson | 104/283 |

FOREIGN PATENT DOCUMENTS

| | | | |
|---|---|---|---|
| 2135970 | 2/1973 | Fed. Rep. of Germany | 198/619 |
| 53-11420 | 1/1978 | Japan | 104/284 |
| 55-93705 | 1/1979 | Japan | 198/619 |
| 1035764 | 7/1966 | United Kingdom | 104/283 |
| 2065066 | 6/1981 | United Kingdom | 414/347 |
| 313246 | 8/1971 | U.S.S.R. | 198/619 |

OTHER PUBLICATIONS

"Rail Transit Technology", *Progressive Railroading*, Oct. 1981, pp. 48–50.

*Primary Examiner*—Robert B. Reeves
*Assistant Examiner*—David F. Hubbuch
*Attorney, Agent, or Firm*—Poms, Smith, Lande & Rose

[57] ABSTRACT

A semiconductor wafer transportation apparatus includes a car for supporting a semiconductor wafer, a track for guiding the car, and a linear induction motor for levitating and linearly propelling the car along the track. The motor includes a plurality of permanent magnets disposed on the car, a plurality of linearly disposed and selectively energizable electromagnets disposed along the track and circuitry to sequentially energize the electromagnets. Positioning magnets are used to eliminate friction between the car and the track, to control the degree of levitation and to insure precise lateral positioning of the car on the track, and light emitting diodes are used to detect the position of the car on the track.

10 Claims, 7 Drawing Figures

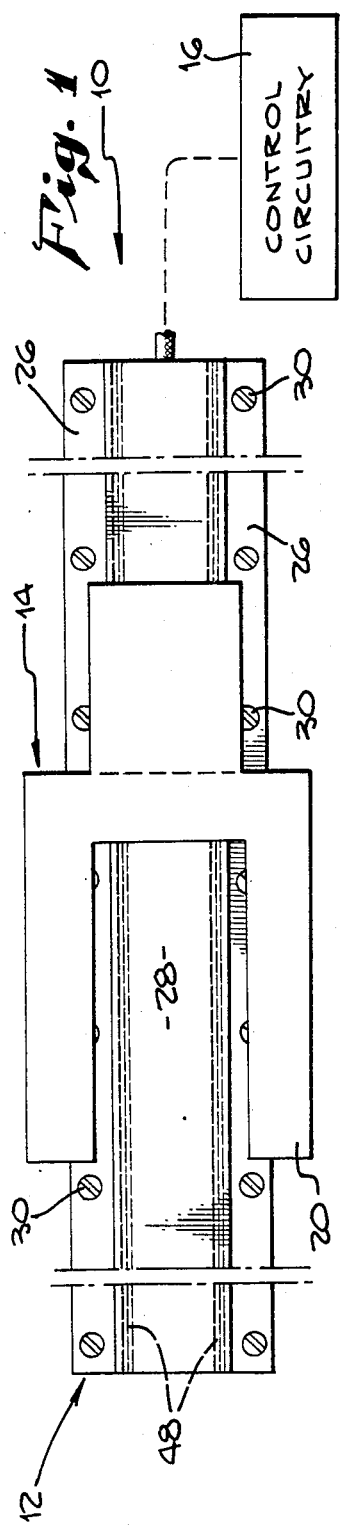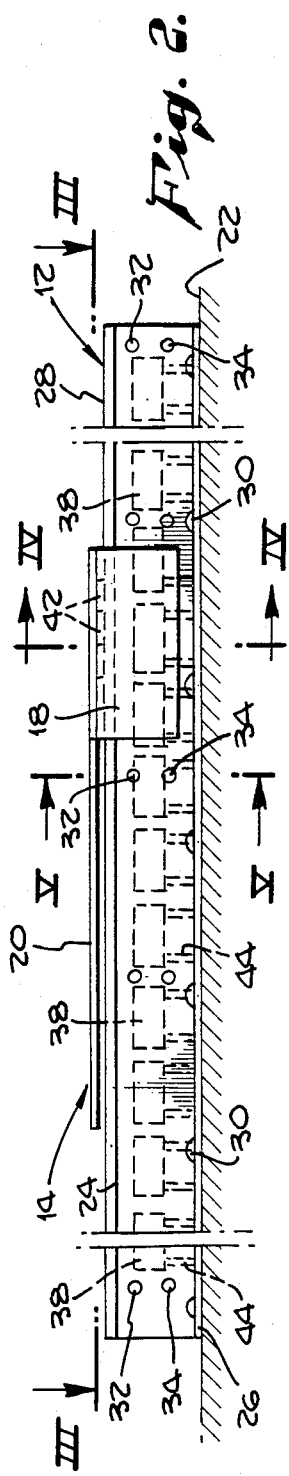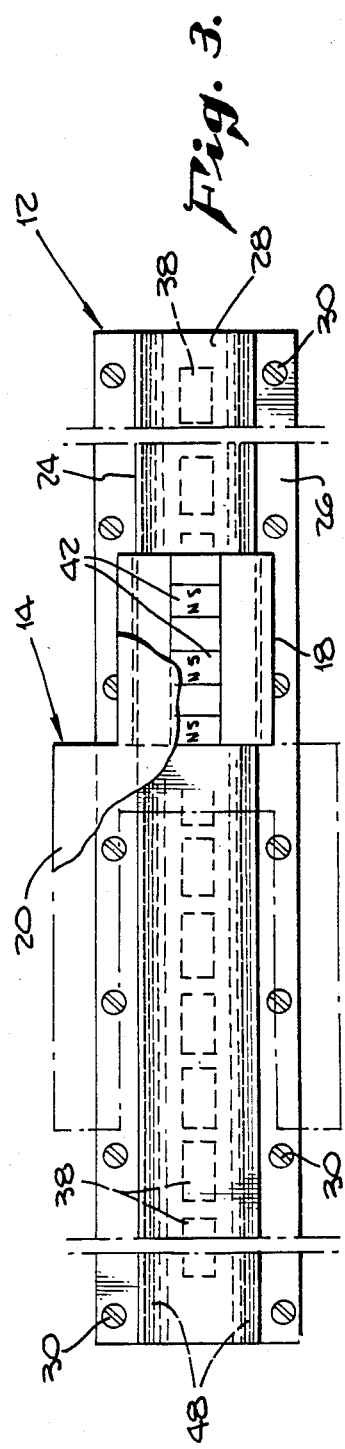

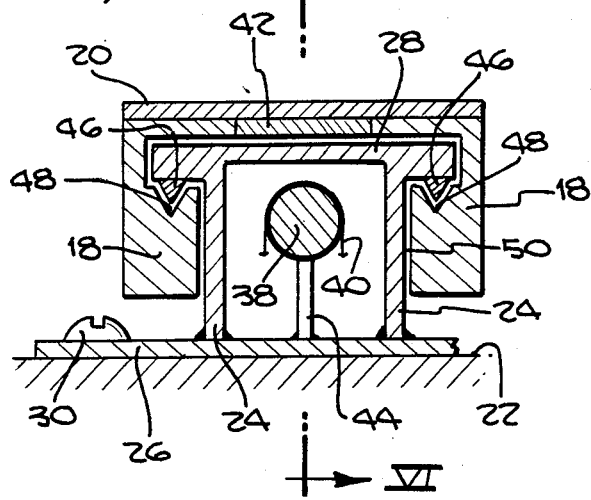
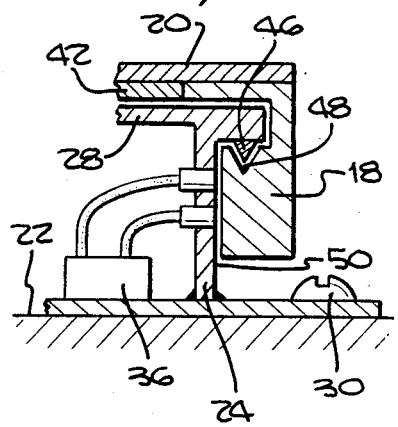
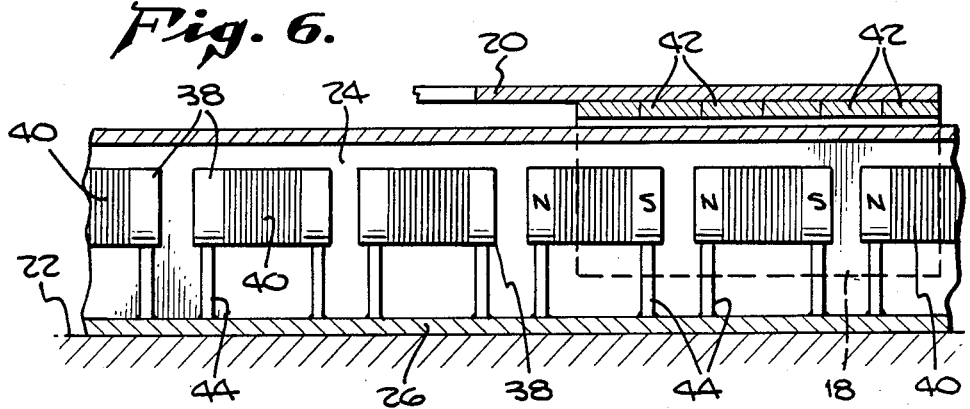
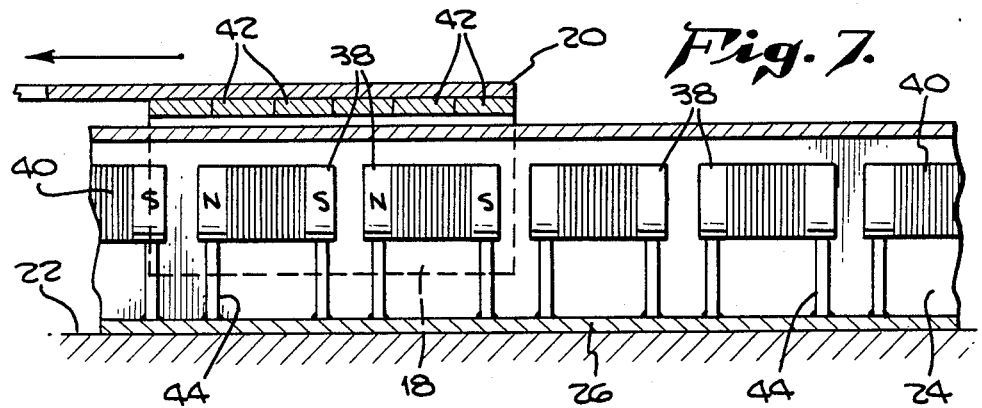

4,624,617

LINEAR INDUCTION SEMICONDUCTOR WAFER TRANSPORTATION APPARATUS

FIELD OF THE INVENTION

The invention relates generally to devices for transporting semiconductor wafers during fabrication and assembly and, more particularly, to devices which transport semiconductor wafers in and out of process chambers through vacuum valves.

BACKGROUND OF THE INVENTION

Integrated circuit semiconductor devices are fabricated in multiple arrays from thin slices or "wafers" of semiconductor material. such processing generally begins with the fabrication of a thin polished slice of a single crystal material formed by slicing across a single crystal ingot which may have a diameter of about one inch or more. The polished slice is then subjected to a succession of photoresist masking, impurity diffusion, and metal deposition operations to form an array of semiconductor devices which may range from several hundred to several thousand, depending upon the size and complexity of the integrated circuit. Each of these operations is generally performed in a different location with different equipment. As the wafers are generally held in cassettes for processing, the wafers must be passed through the various machines, from one cassette to another during the fabrication process.

Many different devices have been proposed to transport the wafers, but all generally have certain disadvantages. For example, many of the electromechanical transportation systems currently in use require electrical connections to the portion of the mechanism which moves the wafer. The common type of wafer transfer mechanism has the problem of friction contamination because of the contact of various mechanical parts which produces a fine dust contaminating both the clean rooms in which the wafers are produced, as well as the wafers themselves. Likewise, because of the precise positioning requirements demanded in integrated circuit fabrication, many of the devices currently used are complicated electromechanically in order to achieve the desired positioning accuracy. An additional problem has been the difficulty in moving the semiconductor wafer from one transportation mechanism to another, as is required, for example, when wafers are moved through vacuum valves which appear at the entrances of many of the machines utilized in integrated circuit fabrication.

Accordingly, it is the principal object of the present invention to move semiconductor wafers in a simple and efficient manner through the various machines used in integrated circuit fabrication, process and inspection.

It is a further object of the present invention to facilitate the automatic transfer of semiconductor wafers between integrated circuit processing machines.

Yet another object of the present invention is to accurately position a semiconductor wafer for processing.

SUMMARY OF THE INVENTION

The present invention, in a broad aspect, provides a linear induction transportation mechanism for semiconductor wafers which includes a car adapted to support a semiconductor wafer, a track for guiding the car, and a linear induction motor for levitating and linearly propelling the car along the track.

In accordance with one feature of the invention, the linear induction motor includes a plurality of permanent magnets disposed on the car, a plurality of linearly disposed and selectively energizable electromagnets disposed along the track, and circuitry to sequentially energize the electromagnets, whereupon the sequential energizing both levitates and linearly propels the car.

In accordance with another feature of the invention, levitation of the car along the track is controlled and precise lateral positioning is facilitated with a levitation control apparatus which includes a magnetic channel disposed along the car, and a magnetic flange disposed on the track and oriented to repel the magnetic flange. The repulsion of the magnetic flange and the magnetic channel pulls the car toward the track with a force that is partially overcome by the levitation force produced by the electromagnetics. The electromagnets thus levitate the car off the track, but the amount of levitation is controlled by the levitation control apparatus, which also maintains the car disposed in precise lateral arrangement to the track as it moves along the track.

In accordance with the final feature of the invention, the position of the car along the track is deetermined with a plurality of light emitting diodes, a plurality of phototransistors, and a reflective coating on the inside of the car. As the car passes along the track, the light from the light emitting diodes is reflected by the reflective coating onto the photo transistors, thereby indicating the position of the car.

Further objects, features, and advantages of the present invention will become apparent from a consideration of the following detailed description and the accompanying drawings.

BRIEF DESCRIPTION OF THE DRAWINGS

FIG. 1 shows a top view of the semiconductor wafer transportation apparatus according to the present invention;

FIG. 2 shows a side view of the invention of FIG. 1;

FIG. 3 shows a cross-sectional view of the invention of FIG. 2, taken through the plane III—III;

FIG. 4 shows a cross-sectional view of the invention of FIG. 2, taken through the plane IV—IV;

FIG. 5 shows a cross-sectional view of the invention of FIG. 2, taken through the plane V—V;

FIG. 6 shows a cross-sectional view of the apparatus of FIG. 4, taken through the plane VI—VI; and FIG. 7 shows a second cross-sectional view of the invention of FIG. 4, taken through the plane VII—VII.

DETAILED DESCRIPTION

Referring more particularly to the drawings, FIG. 1 shows a top view of a semiconductor wafer transportation mechanism 10 according to the present invention. The mechanism 10 includes a track 12 upon which rides a car 14, with the movement of the car 14 relative to the track 12 being determined by control circuitry 16.

The car 14 includes, as shown in FIGS. 1 and 4, a U-shaped fork 20 attached to a pair of guides 18 which engage the track 12. The track 12 includes a bottom flange 26 to which is attached a pair of vertical support flanges 24 supporting a horizontal track 28. The guides 18 from the car 14 are disposed in close proximity to the vertical supports 24 and are each provided with an opening to engage the horizontal track 28. A small gap is provided between the car guides 18 and the vertical supports 24 of the track. The bottom flange 26 of the track is secured by screws 30 or the like to a track bed 22.

The car 14 is moved along the track 12 by linear induction. The linear induction motor used in the apparatus 10 of the present invention includes a plurality of permanent magnets 42 disposed in the car 14 beneath the fork 20 and between the car guides 18. As shown best in FIGS. 3 and 6, a plurality of these permanent magnets 42 are provided with the magnets 42 being arranged such that the north and south pole ends are adjacent. Cooperating with the magnets 42 is a series of electromagnets beneath the track 12, each electromagnet comprising a pole piece 38 supporting a coil 40 and supported upon the track flange 26 by a pair of supports 44. Each of the coils 40 is connected to the control circuitry 16, which is conventional circuitry known in the art. The control circuitry 16 sequentially energizes each of the coils 40 to move the car 14 along the track 12. The sequential energizing of the electromagnets is shown in FIGS. 6 and 7.

Precise control of the degree of levitation of the car 14 relative to the track 12 is facilitated by means of a pair of permanent magnetic grooves 48 in the car guides 18 having a generally "V" shape. Disposed opposite the grooves 48 are two V-shaped magnets 46 depending downwardly from the horizontal track 28. Each of these grooves 48 is magnetized to the same polarity as that of the permanent magnets 46. Such magnetization may be accomplished either by direct magnetizing of the grooves 48 in the car guides 18, or by the positioning of magnetic material in the car guides 18.

Prior to the car 14 being moved along the track 12, the repulsion between the magnets 46 and the grooves 48 pulls the car 14 toward the track 12. When the control circuitry 16 energizes the electromagnets, the repelling force of the electromagnet formed by each coil 40 and its pole piece 38 overcomes the repulsion between the V-shaped magnets 46 and the V-shaped channels 48 and the car 14 is levitated upwardly off the track 12. As the electromagnets are sequentially energized, as shown in FIGS. 6 and 7, the car 14 moves linearly along the track. The energizing of the electromagnets results in the car 14 being drawn down against the track 12. In this manner, the degree of levitation is controlled. This arrangement, because of the localized nature of the magnetic fields of the grooves 48 and the magnets 46, also insures precise lateral control of the car 14 relative to the track 28 as the car moves down the track.

The levitating of the car 14 above the track is what facilitates transfer of the wafers between various cars 14 through the use of the U-shaped fork 20. The U-shaped portion 20 of each car is adapted to engage the narrower rear portion of an adjacent car. The semiconductor wafer is suspended by the arms of the fork 20. When transfer of a wafer positioned on one car 14 to an adjacent car 14 is desired, the car 14 is moved forwardly until the fork 20 surrounds the rear portion of the adjacent car, which is assumed to be in a de-energized state. The car 14 supporting the wafer is then also de-energized, causing the positioning magnets 48 to draw the car downwardly toward the track 12. When this occurs, both the transporting car and the receiving car are at the same level. The receiving car is then energized with the electromagnets beneath it, whereupon it rises and lifts the wafer from between the arms of the fork 20 of the adjacent car.

In this manner, the provision of the fork 20, which suspends beyond the end of the track 12, allows transfer of a semiconductor wafer to another track section. This feature is particularly helpful when used with vacuum valves typically found in semiconductor processing equipment, as it allows the fork 20 to extend into the vacuum valves to allow removal of the wafer. This particular provision will greatly enhance the processing of the wafers.

Precise determination of the location of the car 14 along the track 12 is made possible with a plurality of light emitting diodes 32 and accompanying phototransistors 34 which extend through the vertical support flanges 24 of the track 12. The light emitting diodes 32 and the phototransistors 34 are connected to appropriate circuitry 36 as known in the art. Cooperating with the light emitting diodes 32 and the phototransistors 34 is a reflective coating 50 disposed on each of the car guides 18. Accordingly, as the car 14 passes the light emitting diodes 32, the reflective surfaces 50 and each of the car guides 18 reflect the light from the light emitting diodes 32 onto the photo transistors 34 to indicate the position of the car 14.

The foregoing system uses a completely frictionless means of linearly propelling semiconductor wafers in and out of process control apparatus to eliminate particulate contamination. This system would also be of great benefit in transporting cassettes of wafers between stations or machines in a semiconductor processing operation. The control circuitry 16 could be conventional digital computer technology as known in the art. The novel design of the present invention would allow for easy interfacing with a computer system, with changes in the travel of the car 14 being easily controlled with computer software. Such a system would provide a significant benefit over those systems in use today. Various types of sensors could be utilized in place of the light emitting diodes to determine the position of the car, such as the capacitive positioning detectors discussed below.

In the foregoing description of the present invention, a preferred embodiment of the invention has been disclosed. It is to be understood that other mechanical and design variations are within the scope of the present invention. Thus, for example, the V-shaped magnets on the car and corresponding cutouts on the track could be shaped and/or positioned differently to accomplish the same result. Likewise, the magnets in the car and electromagnets on the track could also be disposed differently to accomplish the same purpose. Capacitive positioning detectors could also be used instead of the light emitting diodes to determine the position of the car. Electromagnetic means instead of the V-shaped magnets and grooves could be used to control the levitation. Accordingly, the invention is not limited to the particular arrangement which has been illustrated and described in detail herein.

What is claimed is:

1. A linear induction transportation mechanism for semiconductor wafers, comprising:
   car means for supporting a semiconductor wafer, said car means including a body portion and a wafer support portion attached to said body portion and adapted to engage the body portion of an adjacent car means to allow said semiconductor wafer to be transferred to said adjacent car means;
   track means for guiding said car means;
   linear induction motor means for levitating and linearly propelling said car means along said track means; and control means for precisely controlling the amount of said levitating and for regulating the lateral movement of said car means relative to said track means.

2. A mechanism as defined in claim 1, wherein said linear induction motor means comprises:
   a plurality of permanent magnet means disposed in said car means;
   a plurality of linearly disposed and selectively energizable electromagnetic means disposed adjacent said track means; and
   circuitry means for sequentially energizing said electromagnet means, whereby said sequential energizing both levitates and propels said car means.

3. A semiconductor wafer transport apparatus comprising:
   track means;
   car means, adapted to be electromagnetically supported from said track means, for supporting said semiconductor wafer, said car means including a plurality of permanent magnet means, a body portion surrounding said track means, with said permanent magnet means being disposed on said body portion, and a semiconductor wafer support portion attached to said body portion and adapted to engage the body portion of an adjacent car means whereby said semiconductor wafer may be transferred to said adjacent car means;
   a plurality of selectively energizable electromagnet means, linearly disposed adjacent said track means, for repelling said permanent magnet means when energized; and
   circuitry means, coupled to said electromagnet means, for sequentially energizing said electromagnet means, said sequential energizing both levitating and linearly propelling said car means along said track means.

4. An apparatus as defined in claim 3, wherein said apparatus further comprises:
   levitation control means for controlling the degree of levitation of said car means relative to said track means.

5. An apparatus as defined in claim 4, wherein said levitation control means comprises:
   magnetic channel means disposed on said car means; and
   magnetic flange means, disposed on said track means and oriented to repel said magnetic channel means, whereby said repulsion of said magnetic flange means and said magnetic channel means draws said car means toward said track means, thereby partially offsetting said levitating effected by said electromagnet means to control said levitating.

6. An apparatus as defined in claim 5, wherein:
   said magnetic flange means comprises a pair of continuous V-shaped permanent magnets disposed along opposite sides of said track means; and
   said magnetic channel means comprises a pair of permanent magnets, each having a V-shaped recess, disposed along said car means.

7. An apparatus as defined in claim 4, wherein:
   said levitation control means also comprises means for insuring precise lateral positioning of said car means relative to said track means as said car means linearly moves along said track means.

8. An apparatus as defined in claim 3, wherein said track means comprises:
   a generally T-shaped continuous channel member having a horizontal surface supported by at least one vertical support member, whereby said car means is electromagnetically supported above said horizontal surface.

9. An apparatus as defined in claim 3 wherein said apparatus further comprises:
   positioning means for detecting the location of said car means on said track means.

10. An apparatus as defined in claim 9, wherein said positioning means comprises:
    a plurality of light emitting means disposed along said track means;
    a plurality of light detecting means disposed adjacent said light emitting means on said track means; and
    reflective coating means disposed from the portion of said car means adjacent said track means, whereby as said car means passes along said track means, said reflective coating means reflects said light from said light emitting means onto said light detecting means, thereby indicating said location.

* * * * *